Figure 1:
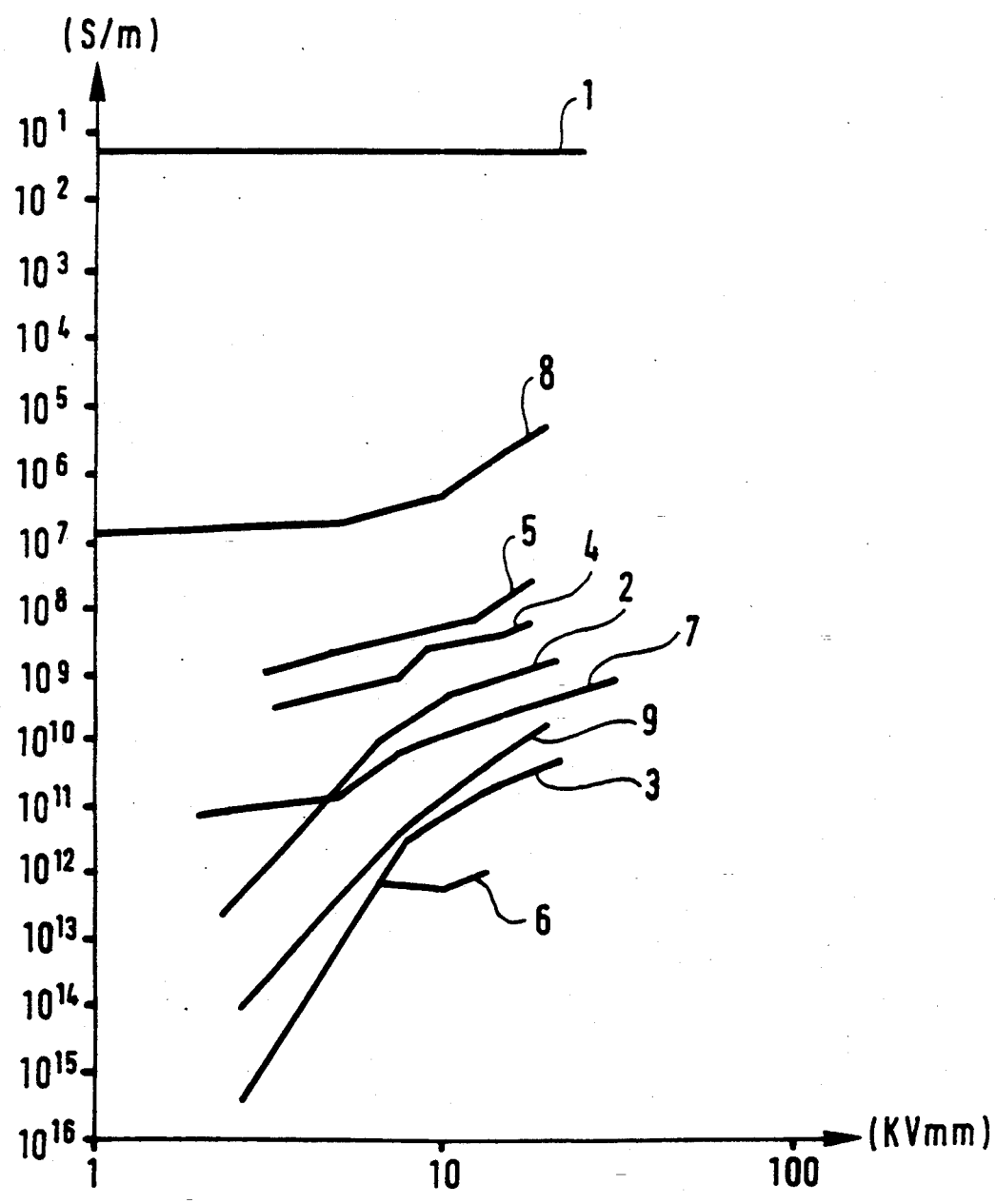

United States Patent [19]

Aladenize et al.

[11] Patent Number: 5,416,155
[45] Date of Patent: May 16, 1995

[54] MATERIAL FOR SEMICONDUCTIVE SCREENING

[75] Inventors: Bernard Aladenize, Epinay-sur-Orge; Stanislas Galaj, Arcueil; Alain Le Mehaute, Gif-sur-Yvette, all of France; Etienne Hannecart, Tervuren; Claude Franquinet, Brussels, both of Belgium

[73] Assignees: Alcatel Cable, Clichy Cedex, France; Solvay, Brussels, Belgium

[21] Appl. No.: 129,210

[22] PCT Filed: Apr. 1, 1992

[86] PCT No.: PCT/FR92/00292

§ 371 Date: Oct. 15, 1993

§ 102(e) Date: Oct. 15, 1993

[87] PCT Pub. No.: WO92/17995

PCT Pub. Date: Oct. 15, 1992

[30] Foreign Application Priority Data

Apr. 2, 1991 [FR] France ............ 91 03955
Jan. 28, 1992 [FR] France ............ 92 00870

[51] Int. Cl.$^6$ ............ C08K 3/04; H01B 1/00
[52] U.S. Cl. ............ 524/495; 524/496; 252/500; 252/511; 525/535; 525/540; 528/377; 528/423
[58] Field of Search ............ 524/495, 496; 523/137; 525/540; 528/377, 422, 423; 252/500, 511

[56] References Cited

U.S. PATENT DOCUMENTS 4,971,726 11/1990 Maeno et al. ............ 252/511
5,294,694 3/1994 Epstein et al. ............ 528/422

FOREIGN PATENT DOCUMENTS 0399299 11/1990 European Pat. Off. .
2596403 10/1987 France .
3305401 8/1984 Germany .
3230737 9/1988 Japan .
90/08808 8/1990 WIPO .
WO9009027 8/1990 WIPO .

Primary Examiner—Paul R. Michl
Assistant Examiner—Tae H. Yoon
Attorney, Agent, or Firm—Sughrue, Mion, Zinn, Macpeak & Seas

[57] ABSTRACT

The present invention relates to a material for semiconductive screening and to use of the material in manufacturing cables and capacitors, and in electromagnetic shielding of electrical and electronic apparatus. The present invention further relates to cables and electrical and electronic apparatus containing the material. The semiconductive screening is formed of a polymer matrix containing one or more polymers and in which matrix 5% to 70% (by weight) of at least one conjugated non-doped or dedoped polymer is to be found in the dispersed state. In the absence of an electric field, the conductivity of the screening is very low, but said conductivity is an increasing function of the applied field (see curves 2 to 9 in the figure).

9 Claims, 2 Drawing Sheets

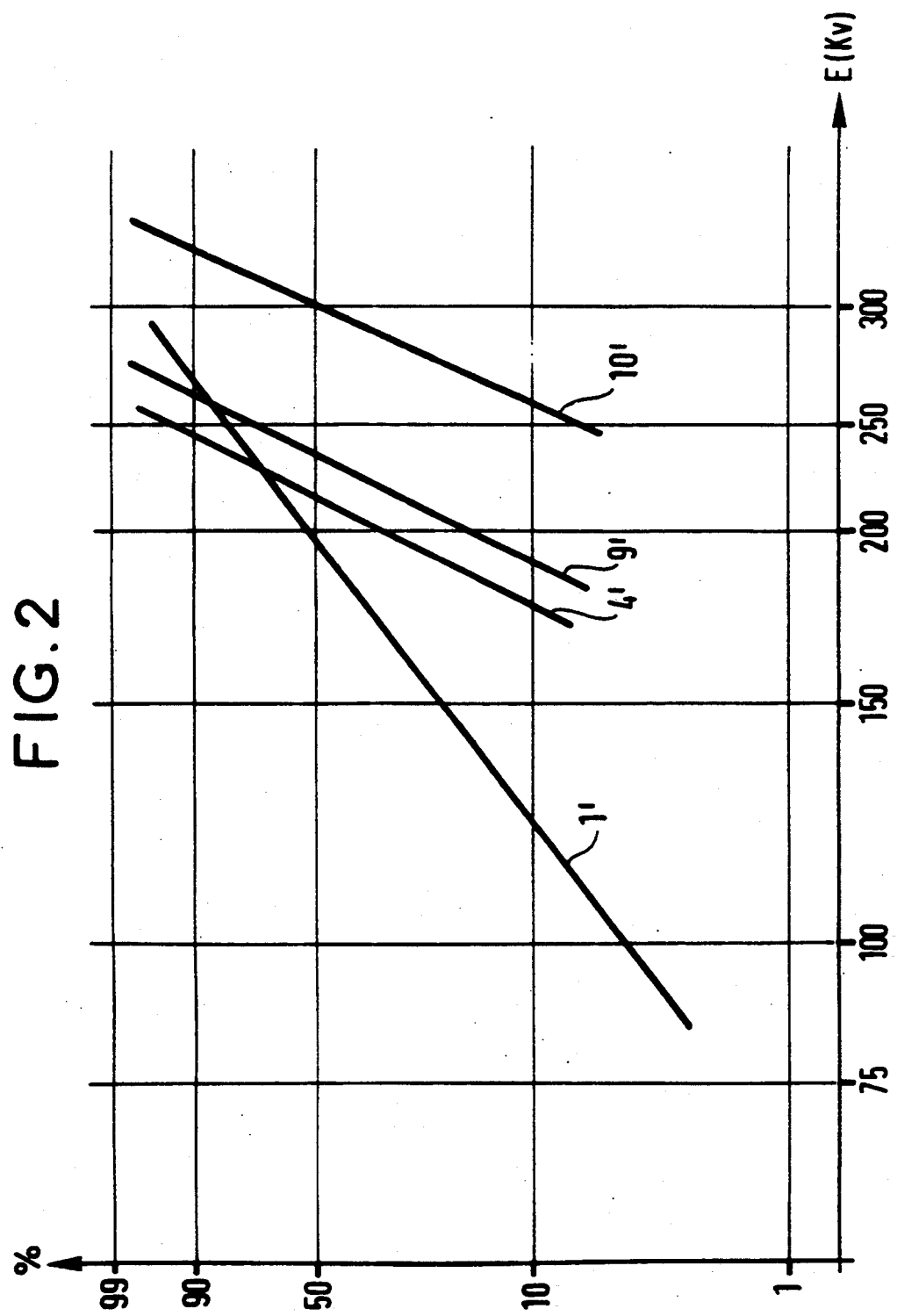

MATERIAL FOR SEMICONDUCTIVE SCREENING

The present invention relates to a material for semiconductive screening and to use of the material in manufacturing cables and in electromagnetic shielding of electrical and electronic apparatus.

In a conventional configuration, a cable is constituted by a length of twisted-together metal strands, which length is covered by copper foil and surrounded by an insulating sheath, e.g. made of polyethylene. In another conventional configuration, given by way of example, the twisted-together metal strands are directly covered by an insulating sheath. Such cables are used on a very large scale in various fields, such as telecommunications, transporting power, etc. Such cables convey electromagnetic energy in DC form or at low, high, and very high frequency with or without repeaters. When in use, such cables are therefore subjected to electric fields and to space charges, characterized by depolarization currents with high time constants, which currents, for certain polarization voltages, give rise to anomalies in behavior.

In those configurations and in other conventional configurations where the insulating sheath is, for example, placed on the body of the cable, which cable body is either a central or an outer body, the maximum field is situated at the conductor-insulator interface. A typical value for the field lies in the range a few kV/mm to about ten kV/mm. Therefore, the interface is particularly stressed. In addition to the maximum field being localized, there are problems of conductor uniformity. If the conductor has irregularities, they generate concentrations of electric field, and this in turn reduces the capacity of the cable to withstand voltage gradients. It is therefore necessary to increase the thickness of the insulation so as to ensure that no breakdown will occur even if there are projections. Such a solution is expensive.

The problem of insulation size is particularly critical at splices, at branches and at the ends of high tension cables.

The problems encountered when using and making cables also occur in substantially the same way in electrical energy storage devices, and in particular in capacitors. Such problems also occur when using electrical or electronic equipment in which an insulator protects a region containing apparatus sensitive to an electric field source. For example, the source may be a current generator, electrical cables or pins, transmitter antennas, etc. For example, the sensitive apparatus may be measuring apparatus, an F.M. type receiver, or printed circuits of the type contained in a micro-computer. In all these types of apparatus, it is necessary to insert an insulator which is sometimes situated in direct contact both with the equipment and the source of the field.

In order to mitigate these problems, it has been proposed to interpose a semiconductive screen between the conductor and the insulator, or between the source and the insulator. Semiconductive screening used up until now is formed of carbon black dispersed in an extruded, calendered or molded matrix usually formed of EVA (ethylene vinyl acetate) or EBA (ethylene butyl acrylate). The main drawbacks with that type of semiconductive screening are that its conductivity remains constant as a function of field, and that it does not make it possible to reduce the volume of insulation sufficiently.

It has also been proposed, e.g. in Document WO 90/09027, to make semiconductive screening from an intrinsically conductive composite material constituted by a polymer matrix, e.g. made of polyolefin, polyvinyl chloride, or polystyrene, which matrix has a substituted polythiophene incorporated therein. The conductivity of such a material is a function of the quantity of doping agents it contains. But the very presence of the doping agents is a major drawback to the physical and chemical stability of the screening under high tension, and in the presence of a high electric field.

An object of the present invention is to implement a material for semiconductive screening, which material has a conductivity that increases as a function of the applied field, and, at the same time, has good physical and chemical stability even if the field is very strong.

The present invention provides a material for semiconductive screening, said material including a polymer matrix comprising at least one insulating first polymer and in which matrix at least one conjugated second polymer is incorporated, said material being suitable for being shaped by molding, extrusion, injection or calendering, said material being characterized by the fact that said conjugated second polymer is not doped or is dedoped, and is not intrinsically conductive, having conductivity which is less than $10^{-4}$ S/m, but which is capable of increasing under the effect of an electric field, the concentration of the second polymer in said matrix lying in the range 5% to 70% by weight, said material having conductivity which is less than $10^{-8}$ S/m, but which is capable of increasing under the effect of said electric field.

Preferably, said conductivity of said non-doped or dedoped conjugated second polymer lies approximately in the range $10^{-7}$ S/m to $10^{-8}$ S/m and said conductivity of said material lies approximately in the range $10^{-9}$ S/m to $10^{-10}$ S/m.

Said polymer matrix may further contain a conductive filler of the carbon black type in a concentration of less than 30%.

Said polymer matrix may include at least one thermoplastic polymer chosen from resins made of acrylic, styrene, vinyl and cellulose, and from polyolefins, fluoride polymers, polyethers, polyimides, polycarbonates, polyurethanes, and mixtures and copolymers thereof.

In specific embodiments, the polymer is chosen from polypropylene (PP), polyethylene (PE), the copolymer of ethylene and vinyl acetate (EVA), ethylene propylene terpolymer (EPDM), polyvinylidene fluoride (PVDF), ethylene butyl acrylate (EBA), and mixtures thereof.

In other embodiments, said polymer matrix comprises at least one thermosetting polymer chosen from polyesters, epoxy resins, and phenol resins.

Said conjugated second polymer may be chosen from the group comprising polyaniline, polythiophene, polypyrrol, polyacetylene, polyparaphenylene, polyalkylthiophenes, and derivatives and mixtures thereof.

It is very important for said conjugated polymer to be non-doped, i.e. not to contain ionic groups:
either fixed on the molecule (e.g. sulfonic groups);
or free (e.g. acids, bases, metal salts).

If the presence of such groups results from the synthesis of the conjugated polymer, the conjugated polymer should be dedoped.

If it contains no conductive filler of the carbon black type, the material of the invention is insulating at low fields, and its conductivity increases as a function of the field.

If it contains a certain quantity of additional conductive filler, the filler makes the material of the invention slightly conductive at low fields.

Under the effect of a high field, the conductivity of the material of the invention is amplified.

Regardless of whether or not it contains said additional filler, the material of the invention is physically and chemically very stable under high fields.

The properties of the material of the invention used as semiconductive screening make it possible to stabilize the field at the insulator-conductor interface, and to limit the field in the insulator.

The first polymer and the second polymer are chosen from the above-defined groups as a function of their specific properties and of the particular advantages they can offer.

By way of example, if the polymer matrix is based on a fluoride polymer, the fluoride polymer forms "charge transfer" complexes with the second polymer. If the polymer matrix is based on a polycarbonate, the polycarbonate gives screening made of a material of the invention an excellent external appearance.

In a preferred embodiment, the material of the invention is formed of a polymer matrix made of polyethylene into which matrix dedoped polythiophene is incorporated. Advantageously, the concentration of dedoped polythiophene is about 60% by weight.

In another preferred embodiment, the material of the invention is formed of a polymer matrix made of polyethylene into which matrix polyaniline is incorporated in a concentration lying in the range 25% to 35% by weight. In a variant, 26% to 34% of polyaniline and 3% to 8% of carbon black are incorporated into the matrix. In a variant, the polyethylene (PE) of the polymer matrix is replaced by polypropylene (PP), the copolymer of ethylene and vinyl acetate (EVA), ethylene butyl acrylate (EBA), ethylene propylene terpolymer (EPDM), or polyvinylidene fluoride (PVDF), on their own or mixed.

A semiconductive material may be shaped by the conventional methods of extrusion, calendering, or molding, without the electrical properties of said second polymer being deteriorated. It is therefore possible to make semiconductive screening well suited to each use.

Semiconductive screening of the invention can be used for any electrical or electronic equipment. If such equipment contains an insulator covering a conductor or source of a field, the semiconductive screening of the invention is interposed between said insulator and the conductor or source. If the equipment contains an insulator covering equipment to be protected, the semiconductive screening of the invention is then situated outside on the insulator.

Semiconductive screening of the invention can advantageously be used for high tension cables, at the ends of such cables, and for accessories such as cable splices and branches. Using such screening makes it possible to increase breakdown resistance, and to reduce the size of the insulation of said accessories.

Using semiconductive screening of the invention at the input of a DC high tension cable where fluctuations in voltage may appear, damps such fluctuations.

Semiconductive screening of the invention may also advantageously be incorporated into electrical energy storage devices such as capacitors. Like the conductor-insulator interface in electrical cables, the electrode-dielectric interfaces in capacitors may have geometrical imperfections (such as projections) leading to a locally higher value for the electric field, and therefore to an increased risk of breakdown.

Advantageously, the thickness of the dielectric may be reduced by interposing semiconductive screening of the invention between the electrodes and the dielectric. The effects of this are that the electric field is made permanently uniform at the surface of the electrodes, and higher momentary voltage surges are withstood. Capacitors are frequently used to attenuate transient voltage surges resulting, for example, from high power electrical equipment being switched on or off. In such cases, it is also important to make the transient electric field uniform so as to prevent a geometrical fault on an electrode from allowing a momentary voltage surge to cause local breakdown of the dielectric.

Semiconductive screening of the present invention may be interposed in a plurality of ways between the electrodes and the dielectric.

In one embodiment, the electrodes are coated with the material of the invention. In another embodiment, the material of the invention is disposed in the form of a film which is then sandwiched between the electrodes and the dielectric when the capacitor is assembled.

When the dielectric is a polymer material, in a preferred variant embodiment, the polymer matrix of the material of the invention is of the same type as the dielectric.

Semiconductive screening of the invention can also advantageously be used in dielectrics for space-array antennas.

Other characteristics and advantages of the present invention appear from the following description of embodiments given by way of non-limiting example.

In the accompanying drawings:

FIG. 1 shows how the conductivity S/m of a prior art screening material and of a plurality of screening materials of the invention vary as a function of the applied electric field (kV/mm); and FIG. 2 shows the breakdown probability (%) for a prior art screening material and for a plurality of screening materials of the invention as a function of the applied electric field E (Kvolts).

EXAMPLE 1 (PRIOR ART)

Semiconductive screening made of polyethylene (PE) and carbon black.

25 g of carbon black were dispersed in 75 g of polymer (PE). This mixture was then extruded at a temperature of 130° C. in a conventional extruder. The resulting conventional semiconductive screening had the following properties: its dielectric constant was of the order of 150, and its conductivity was of the order of 0.05 S/m (see curve 1 in FIG. 1). Its conductivity remained constant as a function of the field, thereby leading to a linear response for current as a function of the applied field.

Such screening having a thickness of 0.1 m was subjected to an increasing electric field until dielectric breakdown occurred. The results obtained appear on curve 1' in FIG. 2.

EXAMPLE 2

Polyethylene (PE)/dedoped polythiophene (PTh) semiconductive screening.

The material of the invention was prepared as follows:

Firstly, 60 g of dedoped polythiophene powder were mixed with 40 g of polyethylene. The polyethylene was sold by SOLVAY under the name "Eltex(TM) A 3180".

The polythiophene used was prepared as described in European Patent Application EP 350,083. The polythiophene was dedoped with methanol so that, after dedoping, it had a conductivity of $3.10^{-7}$ S/cm.

Such a mixture is preferably made in the tank of a 3 dm$^3$ "Indola" mixer equipped with two rubber balls.

The mixture was agitated for 30 minutes. The mixture was then kneaded for 60 seconds at 180° C. in a "Scamia" type roll micro-mixer having 120 mm diameter rolls rotated at a speed of 30 revolutions per minute (r.p.m.).

The resulting pancake was cut into strips having a width of 30 mm. The strips were fed into a "Conduct Werk CS/15/10/0101" type granulator equipped with a screen having 5 mm×5 mm holes. Granules of about 3 mm×3 mm×3 mm were obtained.

The granules were worked in a "Scamex 20" type extruder equipped with a screw having a diameter D of 20 mm, a length of 20 D, and a compression ratio of 2.16. The head of the screw was provided with a round die of 3 mm in diameter.

The temperature of the machine was set so as to obtain 180° C. in the material leaving the die. The speed of the screw was set to 20 r.p.m. so that the mean transit time of the mixture in the screw was in the range 2 to 3 minutes.

Curve 2 in FIG. 1 shows that the conductivity of this screening is an increasing function of the applied electric field.

A series of tests were performed to verify that all the above-described steps of the method had not degraded the electrical properties of the polythiophene. To this end, samples were taken after the powders had been mixed, after the kneading at 180° C., and after the extrusion at 180° C. The samples were dissolved in 1-2-4 trichlorobenzene at a concentration of 2 g per 100 ml, under nitrogen, at 135° C., for 2 hours. The PTh quantitatively collected was washed with the same solvent and with methanol, and was then vacuum dried. It was redoped with a 0.1M solution of $FeCl_3$ in acetonitrile (the molar ratio $FeCl_3/PTh=1$) in order to prove that it had not been degraded.

Table I gives the conductivity measurements taken which prove that the polymer was not deteriorated by the heat treatment or by the extrusion.

TABLE 1

| Steps | Conductivity after redoping (S/cm) |
| --- | --- |
| Mixing | 25 |
| Kneading | 25 |
| Extrusion | 27 |

EXAMPLES 3 TO 10

The dedoped polyaniline was prepared in three steps:

1—Synthesis 15.5 liters (l) of distilled water and either 5 l of 37% hydrochloric acid or 1.7 l of 36% sulfuric acid were added to a 50 l reactor. The solution was cooled to −5° C. in a thermostatic bath, and then a filtered solution of 3.75 kg of ammonium peroxosulfate in 9 l of water was added drop-by-drop for 48 hours.

2—Washing

The suspension formed in the reactor (polyaniline in its polyemeraldine form) was vacuum sucked into a filtering enclosure. The resulting powder was rinsed with distilled water until a filtrate of pH lying in the range 6.5 to 7 was obtained. The last traces of acid were removed by a one mole/l diluted ammonia solution, and then the product was rinsed until the pH of the filtrate was 7.

The powder was then placed in a "Soxhlet", and the impurities were extracted in vapor phase: with water for 24 hours and then with ethanol for 48 hours.

3—Drying

The polyaniline purified in this way was placed in a closed enclosure having a filtering wall. The enclosure was then placed in an oven at 60° C. in a primary vacuum for 48 hours. The polyaniline had a conductivity of $2\times 10^{-8}$ S/m and was incorporated, as in example 2, into the following polymer matrices: a polyethylene of ethylene propylene terpolymer (EPDM); a copolymer of ethylene and vinyl acetate (EVA); polyvinylidene fluoride (PVDF); polypropylene (PP); or a mixture of polypropylene (PP) and polyvinylidene fluoride (PVDF) in the proportions indicated in Table II (in grams).

TABLE II

| Example No. | Non-doped polyaniline | Polymer matrix | Carbon black |
| --- | --- | --- | --- |
| 3 | 30 g | 70 g PE | 0 |
| 4 | 30 g | 70 g EVA | 0 |
| 5 | 50 g | 50 g EVA | 0 |
| 6 | 30 g | 70 g EPDM | 0 |
| 7 | 15 g | 85 g PVDF | 0 |
| 8 | 30 g | 65 g EVA | 5 g |
| 9 | 30 g | 70 g PP | 0 |
| 10 | 25 g | 70 g PP & 5 g PVDF | 0 |

The curves representative of conductivity as a function of applied field are respectively referenced 3 to 9 in FIG. 1 for examples 3 to 9.

The materials corresponding to examples 4, 9, and 10 were used to make respective screens of 0.1 mm in thickness, each of which screens was subjected to an increasing electric field until electrical breakdown occurred, in the same way as the screening in example 1. The corresponding curves 4', 9' and 10' are given in FIG. 2, and they clearly demonstrate the advantage of the material for semiconductive screening of the invention.

We claim:

1. An insulating material for high-voltage cable sheathing, said material including a polymer matrix comprising at least one insulating first polymer and in which matrix at least one conjugated second polymer is incorporated, wherein said conjugated second polymer is not doped or is dedoped, and is not intrinsically conductive, having conductivity which is less than $10^{-4}$ S/m, but which is capable of increasing under the effect of an electric field, the concentration of the second polymer in said matrix lying in the range 5% to 70% by weight, said material having conductivity which is less than $10^{-8}$ S/m, but which is capable of increasing under the effect of said electric field.

2. An insulating material for high-voltage cable sheathing according to claim 1, wherein said conductivity of said non-doped or dedoped conjugated second polymer lies approximately in the range $10^{-7}$ S/m to $10^{-8}$ S/m and said conductivity of said material lies approximately in the range $10^{-9}$ S/m to $10^{-10}$ S/m.

3. An insulating material for high-voltage cable sheathing according to claim 1, wherein said polymer matrix further contains a conductive filler of carbon black in a concentration of less than 30%.

4. An insulating material for high-voltage cable sheathing according to any one of claims 1 to 3, wherein said polymer matrix comprises at least one thermoplastic polymer selected from the group consisting of resins made of acrylic, styrene, vinyl and cellulose, and from polyolefins, fluoride polymers, polyethers, polyimides, polycarbonates, polyurethane, and mixtures and co-polymers thereof.

5. An insulating material for high-voltage cable sheathing according to claim 4, wherein said polymer is selected from the group consisting of polypropylene (PP), polyethylene (PE), the copolymer of ethylene and vinyl acetate (EVA), ethylene propylene terpolymer (EPDM), polyvinylidene fluoride (PVDF), ethylene butyl acrylate (EBA), and mixtures thereof.

6. An insulating material for high-voltage cable sheathing according to any one of claims 1 to 3, wherein said polymer matrix comprises at least one thermosetting polymer selected from the group consisting of polyesters, epoxy resins, and phenol resins.

7. An insulating material for high-voltage cable sheathing according to claim 1, wherein said conjugated second polymer is selected from the group consisting of polyaniline, polythiophene, polypyrrol, polyacetylene, polyparaphenylene, polyalkylthiophenes, and mixtures thereof.

8. An insulating material for high-voltage cable sheathing according to claim 7, wherein said conjugated second polymer is polyaniline, and said polymer matrix comprises at least one material selected from the group consisting of polyethylene, polypropylene, the copolymer of ethylene and vinyl acetate, ethylene butyl acrylate, ethylene propylene terpolymer, and polyvinylidene fluoride, on their own or mixed.

9. A method of using the insulating material for high-voltage cable sheathing according to claim 1, comprising (A) shading the material by molding, extrusion, injection or calendering, and (B) shielding electrical cables at ends, splices, and branches with the insulating material.

* * * * *